(12) United States Patent
McLean (10) Patent No.: US 7,859,478 B2
(45) Date of Patent: Dec. 28, 2010

(54) DIPOLE ANTENNA WITH IMPROVED PERFORMANCE IN THE LOW FREQUENCY RANGE

(75) Inventor: James S. McLean, Austin, TX (US)

(73) Assignee: TDK Corporation, Chiba (JP)

( * ) Notice: Subject to any disclaimer, the term of this patent is extended or adjusted under 35 U.S.C. 154(b) by 302 days.

(21) Appl. No.: 12/061,213

(22) Filed: Apr. 2, 2008

(65) Prior Publication Data
US 2008/0246682 A1 Oct. 9, 2008

Related U.S. Application Data

(60) Provisional application No. 60/909,810, filed on Apr. 3, 2007.

(51) Int. Cl.
*H01Q 1/50* (2006.01)
(52) U.S. Cl. ........................ 343/860; 343/745; 343/795; 343/850
(58) Field of Classification Search ................. 343/722, 343/745, 749, 795, 850, 860
See application file for complete search history.

(56) References Cited
U.S. PATENT DOCUMENTS

| | | | | |
|---|---|---|---|---|
| 3,560,983 A | * | 2/1971 | Willie et al. | 343/744 |
| 4,145,693 A | | 3/1979 | Fenwick | |
| 4,278,980 A | * | 7/1981 | Ogita et al. | 343/748 |
| 5,016,022 A | * | 5/1991 | Kershaw | 343/750 |
| 5,696,372 A | | 12/1997 | Grober et al. | |
| 6,208,306 B1 | | 3/2001 | McLean et al. | |
| 2002/0175878 A1 | | 11/2002 | Toncich | |
| 2003/0100333 A1 | | 5/2003 | Standke et al. | |
| 2003/0103011 A1 | | 6/2003 | Rogers et al. | |
| 2006/0139211 A1 | | 6/2006 | Vance et al. | |
| 2008/0305749 A1 | * | 12/2008 | Ben-Bassat | 455/77 |

OTHER PUBLICATIONS

International Search Report & Written Opinion, PCT/US2008/059145, mailed Jun. 27, 2008.

\* cited by examiner

*Primary Examiner*—Tho G Phan
(74) *Attorney, Agent, or Firm*—Kevin L. Daffer; Daffer McDaniel, LLP (57) ABSTRACT

A dipole antenna is provided herein with improved performance at a lower end of the antenna's operating frequency range. According to one embodiment, the dipole antenna may include a plurality of antenna elements coupled to impedance transformer via a pair of cones and a pair of ears. The dipole antenna may also include a high-pass matching network specifically configured to improve antenna performance at the lower end of the operating frequency range. For example, a first stage of the matching network (i.e., closest to the antenna elements) may include two series capacitors, while a second stage of the matching network (i.e., furthest from the antenna elements) includes an inductor coupled in shunt between the two capacitors.

20 Claims, 7 Drawing Sheets

On-axis Electric Field Intensity 2.5m in front of antenna at 20 MHz

DIPOLE ANTENNA WITH IMPROVED PERFORMANCE IN THE LOW FREQUENCY RANGE

PRIORITY CLAIM

This application claims priority to U.S. Provisional Application No. 60/909,810 filed Apr. 3, 2007 and is incorporated herein by reference.

BACKGROUND OF THE INVENTION

1. Field of the Invention

This invention relates to antennas and, more particularly, to a high-pass matching network for large, tapered dipole antennas.

2. Description of the Related Art

The following descriptions and examples are given as background only.

Large tapered dipole antennas (sometimes referred to as "biconical antennas") have been used to generate intense electromagnetic fields, especially in the frequency range of about 20-300 MHz. While the radiated electromagnetic field of the antenna is useful, antenna designers have found that the near fields, especially the near electric fields (E-fields), may be exploited to produce even greater intensities than can be achieved with purely radiating fields.

In some cases, the near field may contain two subfield regions referred to as the reactive near field and the radiating near field. The radiating near field, also referred to as the Fresnel region, is the portion of the antenna field that lies between the reactive near field and the far field region, wherein radiation fields predominate and the angular field distribution is dependent upon the distance from the antenna. However, this region may not exist, if a maximum dimension of the antenna is small compared to the wavelength of the radiated electromagnetic energy.

Under most conditions, the near field does not extend very far from the dipole antenna. For an electrically-small dipole antenna, the near field consists almost entirely of the reactive near field, which extends only to a radial distance of about $R=\lambda/2\pi$, where $\lambda$ is the wavelength of the radiated electromagnetic energy. When the antenna is not electrically-small, the near field consists of the reactive and radiating near field regions. In general, the radiating near field region may extend the near field to a radial distance, which is roughly half the physical length of the dipole. It, therefore, becomes clear that the radiating near field region may be extended by increasing the physical length of the antenna. Extending the radiating near field region is particularly useful in field generation for EMS testing, as it is often difficult to achieve requisite field intensities if near field components are not exploited.

In some cases, the near field intensity of a dipole antenna can be maximized by making the antenna length as long as physically possible (i.e., before mechanical interference prevents greater length) and as long as electrically possible (i.e., before antenna length causes the pattern to degrade to an unacceptable point). However, making the antenna as long as physically possible does not prevent the antenna from being electrically-small at the low end of its operating frequency range. Even though physically large, an antenna which is electrically-small at the low end of the operating frequency range will exhibit reduced performance within this range. In some cases, the antenna may be unable to generate acceptable field intensities within its low frequency range.

A need exists for a means to improve antenna performance at lower frequencies without reducing the performance of the antenna at higher frequencies. Such means would enable the antenna to maintain adequate performance over the entire operating frequency range.

SUMMARY OF THE INVENTION

The following description of various embodiments of dipole antennas is not to be construed in any way as limiting the subject matter of the appended claims.

According to one embodiment, an antenna is provided herein with improved performance at a lower end of the antenna's operating frequency range. In general, the antenna may include a plurality of antenna elements coupled to an impedance transformer via a matching network. The matching network may comprise a high-pass matching network, which is specifically configured to improve antenna performance at the lower end of the operating frequency range without affecting antenna performance at the higher end of the operating frequency range. In one embodiment, a first stage of the matching network (i.e., the stage closest to the antenna elements) may include at least two capacitors, each coupled in series between the impedance transformer and a different one of the antennal elements. The capacitors included within the first stage may or may not have the same value of capacitance. A second stage of the matching network (i.e., the stage furthest from the antenna elements) may include an inductor coupled in shunt between the at least two capacitors.

The matching network described herein improves antenna performance at the lower end of the antenna's operating frequency range by positioning the at least two capacitors ahead of the at least one inductor in a network stage (i.e., a first stage), which is arranged closer to the antenna elements. The voltage standing wave ratio (VSWR) is one measure by which antenna performance may be tracked. In one embodiment, use of the matching network described herein may enable the antenna to exhibit a VSWR of less than about 3:1 within the low frequency range. However, the antenna and matching network described herein is not limited to a particular performance value, and may be configured to provide significantly better low frequency performance in other embodiments of the invention.

In general, the antenna may be selected from a group comprising dipole antennas, tapered dipole antennas, and in some cases, monopole antennas (although a monopole antenna would not achieve a balanced antenna design). In one embodiment, the antenna may include a tapered dipole antenna, otherwise referred to as a biconical antenna. Such antennas are particularly useful in EMS testing applications.

In one embodiment, the antenna may include a pair of cones and a pair of ears. The cones may be configured for holding two of the antenna elements at a desired angle. Although substantially any cone angle may be used, a 60° cone angle may be chosen, in one example, to provide the antenna with maximum operating bandwidth (e.g., approximately 2 octaves of bandwidth). The ears are generally configured for providing an electrical and mechanical connection between the antenna elements and the impedance transformer coupled to the antenna. In one embodiment, the inductor may be coupled in shunt across the aforementioned pair of ears. However, the inductor may be coupled somewhat differently in other embodiments of the invention.

In one embodiment, the capacitors may be placed within the housing of the impedance transformer. However, such placement may not be optimal in all embodiments of the invention. In a preferred embodiment, the capacitors are integrated or embedded within the pair of cones. For instance, each cone may be described as including a front portion and a back portion. The front portion is configured for holding two of the antenna elements at a desired angle (such as a 60° cone angle). The back portion is coupled to the front portion and configured for connecting the cone to one of the ears. Each front portion includes one capacitor embedded therein. In order to electrically isolate the capacitor from the impedance transformer, a dielectric material is arranged between the front and back portions before the portions are connected together.

Various means may be used for physically connecting the front and back portions together. In one embodiment, a plurality of screws may be used to connect the front and back portions. In most cases, the screws may be counter-bored within the dielectric material and filled with an insulating material to electrically isolate the front and back portions of the cone. In another embodiment, the front portion, the back portion and the dielectric material may each be formed with a threaded boss, which enables the back portion to be screwed into the dielectric material and the dielectric material to be screwed into front portion. Other means not specifically contemplated herein may also be used.

In addition to the antenna and high-pass matching network mentioned above, a method is provided herein for improving the performance of an antenna at a lower end of the antenna's operating frequency range. It is contemplated that the method may be performed by a manufacturer of the antenna, an end-user or a technician commissioned to install a new antenna or upgrade an existing antenna design. However, the method is not limited to any particular person and may be performed by any person or persons skilled in the art.

In general, the method may be used to install or upgrade an antenna having a plurality of antenna elements. In one embodiment, the antenna may be a tapered dipole antenna comprising four antenna elements. As noted above, the antenna elements may be coupled to an impedance transformer via a high-pass matching network comprising at least two series capacitors and one shunt inductor. It should be understood, however, that the method described herein may be adapted for installing or upgrading other types of antennas, having possibly different numbers and/or configurations of antenna elements and matching network components. Although the method steps set forth below are described as if performed in a specific order, one skilled in the art would understand how the steps could be performed in a substantially different order without departing from the scope of the invention.

In one embodiment, the method may begin by providing a pair of cone structures, each configured for holding two of the antenna elements at a desired angle. As set forth above, each of the cone structures may have a capacitor embedded therein. The capacitor may be coupled in series between the impedance transformer and the two antenna elements for providing a first stage capacitance. The capacitors embedded within the pair of cone structures may or may not have the same value of capacitance.

Next, the method may include connecting the back end of each cone structure to an ear structure, which provides an electrical and mechanical connection between the antenna elements and the impedance transformer. Next, an inductor may be coupled across the ear structures to provide a shunt inductance between the capacitors embedded within the cone structures. As noted above, the embedded capacitors and the shunt inductor may operate to improve the performance of the dipole antenna at the lower end of the antenna's operating frequency range.

In some cases, the method may end after connecting the antenna elements originally included within the antenna to the front end of the cone structures. In other cases, it may be desirable to exchange the antenna elements for new ones. In one embodiment, the method may include providing a second plurality of antenna elements, which are physically and electrically longer than the plurality of antenna elements originally included within the antenna. The second plurality of antenna elements may be coupled to the front end of the cone structures, in lieu of the original antenna elements, to increase a near field intensity generated by the antenna during operation thereof.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

In general, an "antenna" is a transducer that is configured to convert electromagnetic waves into electrical signals, and vice versa. A "transmission line" or "feed line" is typically used to convey the signal energy from a signal source to the antenna. All antennas radiate some energy in all directions in free space. However, careful construction generally results in substantial transmission of energy in a preferred direction and negligible energy radiated in other directions. In most cases, an antenna with specific properties can be created by adding additional conducting rods or coils (called "elements") and/or by varying the length, spacing or orientation of the antenna elements. Examples of commonly used antenna configurations include, but are not limited to, monopole antennas and dipole antennas.

In some cases, it may be desirable to increase the "bandwidth" or the frequency range over which the antenna is configured to operate. The bandwidth of an antenna may be increased by several techniques, including using thicker conductors, replacing the conductors with cages to simulate a thicker conductor, tapering the conductors, and adding load circuits at regular intervals along the length of the conductors. The load circuits may comprise a select combination of passive circuit elements, including resistors, inductors and/or capacitors.

Another method for increasing the bandwidth of an antenna is to include a matching network at the base of the antenna where it is driven to the ground plane. Ideally, the matching network may be configured to match or balance the characteristic impedance of the antenna to that of the transmission line, or other medium to which the antenna is connected. An impedance transformer is commonly used for this purpose. Many different types of impedance transformers are known in the art. Examples of commonly used impedance transformers include, but are not limited to, equal-delay, Guanella, bootstrap, Ruthroff, and Faraday transformers. In some cases, passive circuit elements (such as resistors, capacitors and/or inductors) may be needed to provide a desired degree of matching. For clarification purposes, the term "matching network" or "matching network components" is used herein to describe the passive circuit elements; the impedance transformer is considered to be a separate and distinct entity.

As set forth below, the present invention provides a matching network specifically configured to improve antenna performance in the low frequency range without affecting antenna performance in the high frequency range. In particular, the present invention provides a high pass matching network, which enables the antenna to provide significantly more base current, and thus, higher near field intensities in the low frequency range. Unlike conventional matching networks, which merely focus on increasing operating bandwidth, the high pass matching network described herein ensures adequate performance over the entire operating frequency range.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals.

The tapered dipole, or biconical antenna, is one example of an antenna that provides relatively large impedance bandwidth. For instance, some commercially available biconical antennas provide approximately 2 octaves of operating bandwidth over which the antenna is reasonably well matched and the radiation pattern is fairly well behaved. This makes the tapered dipole particularly useful in electromagnetic systems (EMS) testing applications, which require acceptable performance over a large frequency range typically extending between about 20 MHz and about 300 MHz. However, tapered dipole antennas are not limited to EMS testing and may be used in many other applications including, but not limited to, the generation and reception of ultra-wideband (UWB) radio signals.

Figure 1:
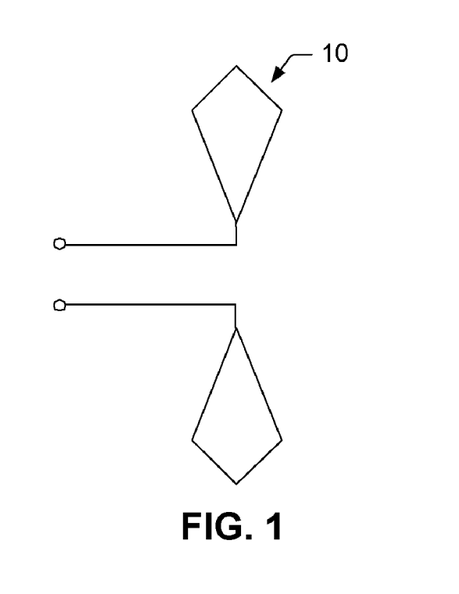
FIG. 1 is a schematic diagram of a biconical antenna.

FIG. 1 illustrates one embodiment of a tapered dipole or biconical antenna 10, which is capable of generating electromagnetic (EM) fields over a large operating frequency range of about 20-300 MHz. In one embodiment, biconical antenna 10 may be constructed with a 60° cone angle and may provide approximately 4:1 bandwidth (i.e., 2 octaves). Biconical antenna 10 may also be relatively well matched to a 200 Ohm source and may provide a useable pattern over most of the operating frequency range, thereby rendering the antenna appropriate for use in many EMC testing applications, such as immunity testing. However, biconical antenna 10 is not limited to any specific cone angle, operating bandwidth, frequency range or application. Instead, the biconical antenna may be tailored to meet the requirements of a specific application.

Some applications may require that the intensity of the generated electomagnetic field be increased in the near vicinity of the antenna (i.e., in the near field). In some cases, the length of the biconical antenna may be extended to increase the intensity of the electric field (E-field) generated thereby. In particular, the near field intensity may be maximized by making the antenna length as long as physically possible (i.e., before mechanical interference prevents greater length) and as long as electrically possible (i.e., before the antenna length causes the pattern to degrade to an unacceptable point).

In one embodiment, biconical antenna 10, approximately 4 meters in length, may be used to provide adequate performance up to a high frequency limit of about 100 MHz. However, antenna performance may suffer at the lower end of the operating frequency range (e.g., around 20 MHz), due to impedance mismatch. In other words, the upper end of the operating bandwidth is primarily limited by pattern degradation. However, antenna performance is generally more than adequate in this range, and therefore, should not be affected by increases in antenna length. The lower end of the operating bandwidth is primarily limited by impedance mismatch. As set forth below, impedance mismatch reduces antenna performance, in some cases, rendering the antenna unusable at the lower end of the operating frequency range.

One measure of impedance match is the voltage standing wave ratio (VSWR), or the amplitude ratio of the reflected wave to the incident wave. The VSWR provides an indication of the amount of power that is reflected due to mismatches between the load impedance and the characteristic impedance of the antenna. If the impedance of the antenna is well matched to the load impedance, the load will absorb the incident wave, so that no reflected wave will be generated at the load. This decreases the VSWR and increases the power transfer between antenna components. On the other hand, impedance mismatches between the antenna and the load cause reflected waves to be generated at the load, thereby increasing the VSWR and reducing the power transfer.

For comparison purposes, a well-matched system may have a return loss (i.e., a ratio of the reflected power to the incident power) of 15 dB or more, which corresponds to a VSWR of about 1.43:1 or less. Though designers strive for a relatively low VSWR value (e.g., a VSWR of 1:1 corresponds to a perfectly matched system), a device may function adequately when it exhibits a 3 dB return loss, or a VSWR of about 5.8:1. For practical purposes, designers typically strive for an impedance match that provides no more than 2:1 to 3:1 VSWR. For critical applications, it may be desired to achieve an impedance match of about 1.5:1 VSWR or better.

Figure 2:
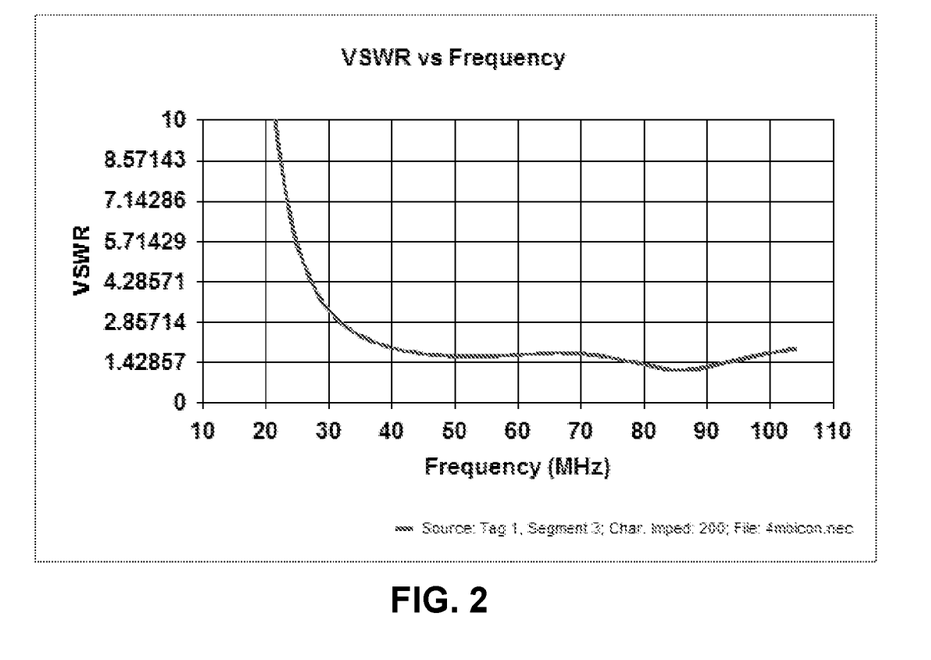
FIG. 2 is a graph illustrating the voltage standing wave ratio (VSWR) of the biconical antenna shown in FIG. 1 over an operating frequency range of about 10-100 MHz.

FIG. 2 illustrates the VSWR provided by the biconical antenna shown in FIG. 1. In particular, the graph illustrates the VSWR obtained from a large biconical antenna (e.g., 4-meters in length) over an operating frequency range of about 20-100 MHz. As shown in FIG. 2, the VSWR is unacceptably high at the lower end of the operating frequency range (e.g., about 7:1 at 25 MHz). This makes it impossible for the biconical antenna (10) shown in FIG. 1 to generate high intensity fields at the lower end of the operating frequency range.

Figure 4:
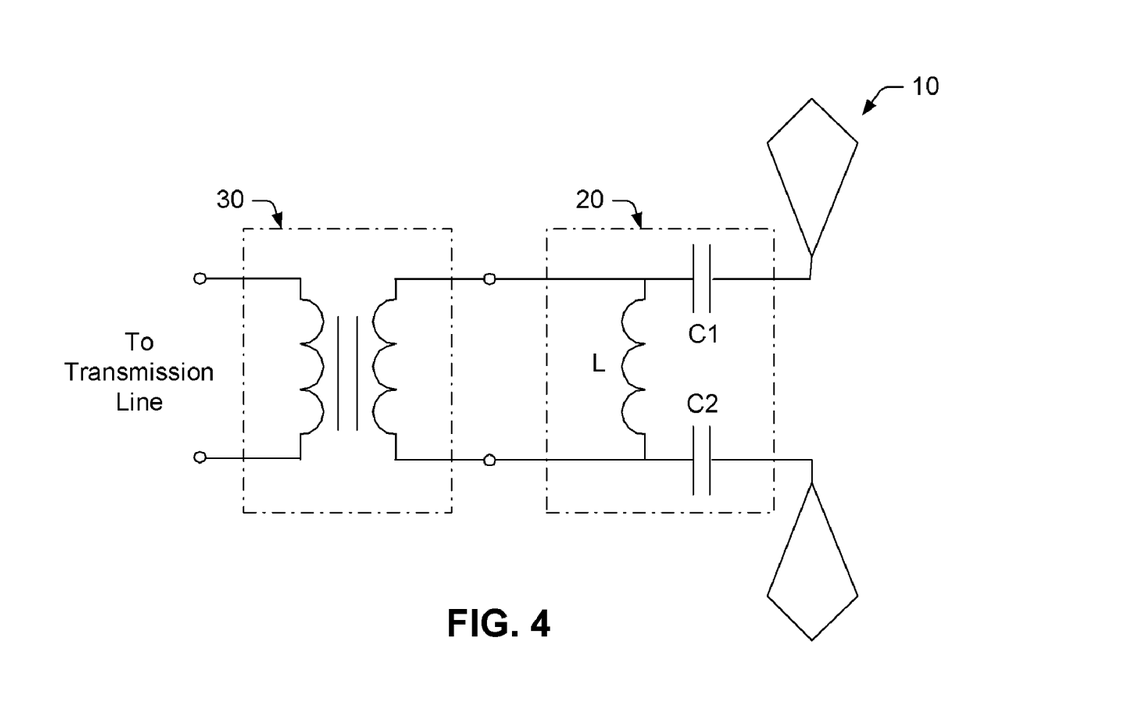
FIG. 4 is a schematic diagram illustrating a biconical antenna including a high-pass matching network and impedance transformer, according to one embodiment of the invention.

In some cases, impedance mismatch may be improved by providing the antenna with high-pass matching network 20 and impedance transformer 30, as shown in FIG. 4. A high-pass matching network is appropriate for the biconical antenna because the antenna, itself, is a high-pass structure. High-pass matching effectively increases the low frequency roll-off of the system transfer function, and thus (like any well-designed matching network), sacrifices out-of-band performance for better in-band performance.

FIG. 4 illustrates one embodiment of a high-pass matching network 20, which may be used to improve the performance of large biconical antenna 10 in the lower end of the operating frequency range. In particular, the illustrated embodiment includes a two-stage, high-pass matching network. The first stage of the matching network (i.e., the stage closest to the antenna) consists of two series capacitors, C1 and C2 (i.e., two capacitors are used for a differential network). The second stage of the matching network (i.e., the stage furthest from the antenna) consists of a single shunt inductance, L1. It should be understood, however, that high-pass matching network 20 shown in FIG. 4 may be implemented in a variety of ways. Various embodiments of suitable high-pass matching networks will be discussed below in reference to FIGS. 9-10.

Figure 3:
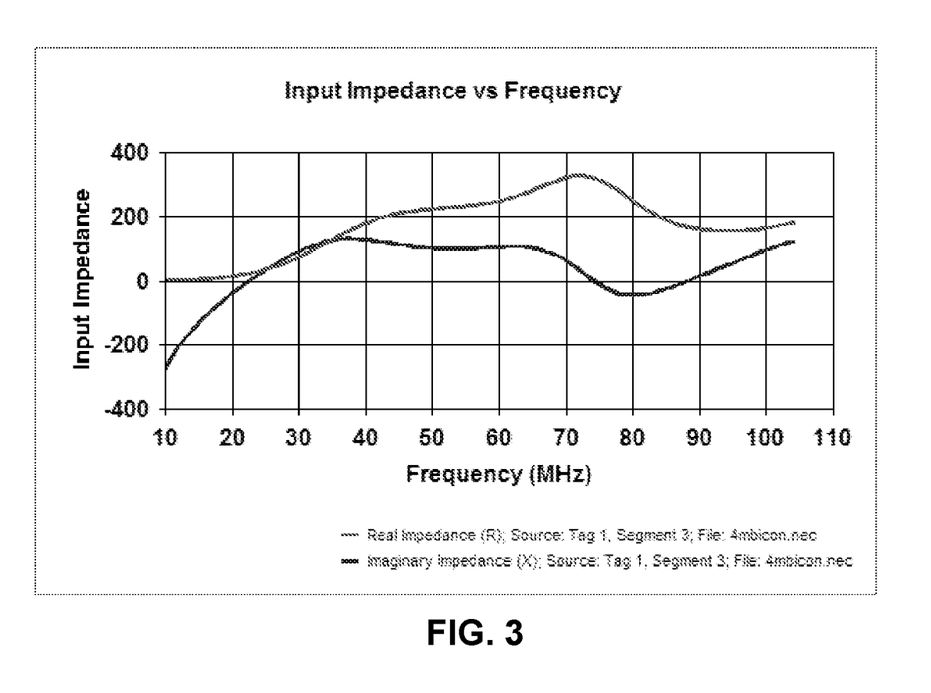
FIG. 3 is a graph illustrating the input impedance of the biconical antenna shown in FIG. 1 over the operating frequency range mentioned above.

The high-pass matching network 20 shown in FIG. 4 is somewhat unorthodox in that the first element is a capacitor. Upon first glance, this might appear to violate traditional rules for matching network design in which the efficiency of an electrically-small antenna is of paramount importance. In this case, however, the length of the biconical antenna is preferably extended as long as possible. Although the input resistance is still much less than 200 ohms, the input reactance of a long dipole antenna is predominantly inductive at the lower end of the operating frequency range (see, e.g., FIG. 3, which illustrates input impedance vs. frequency for a long dipole antenna). This is especially true when the antenna is operated near the ground plane in horizontal polarization. By arranging the series capacitance ahead of the shunt inductance, high-pass matching network 20 shown in FIG. 4 allows antenna 10 to operate more efficiently in the frequency range in which its input impedance becomes inductive (e.g., within the low frequency range).

Figure 5A:
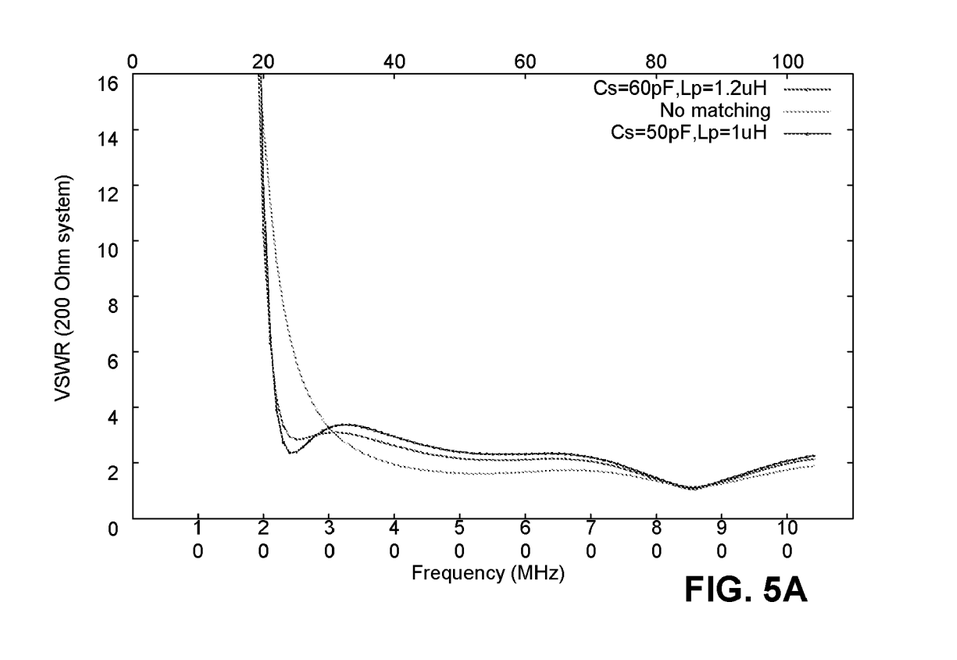
FIG. 5A is a graph illustrating the voltage standing wave ratio (VSWR) of the biconical antenna shown in FIG. 4 over an operating frequency range of about 10-100 MHz.
Figure 5B:
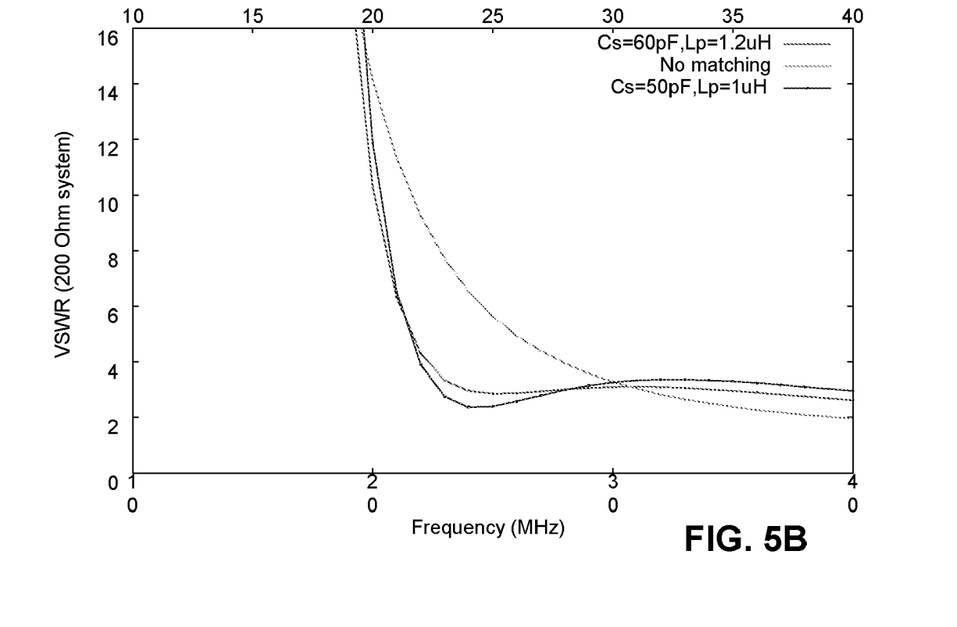
FIG. 5B is a graph illustrating the VSWR generated by the biconical antenna shown in FIG. 4 over the low frequency range of about 10-40 MHz.

FIGS. 5A and 5B illustrate the VSWR provided by biconical antenna 10 and high pass matching network 20 shown in FIG. 4. As before, the VSWR is obtained from a large biconical antenna (e.g., 4 meters in length) over an operating frequency range of about 20-100 MHz. However, the VSWR plotted in FIGS. 5A and 5B shows significant improvement within the low frequency range (e.g., about 2.5:1 at 25 MHz). This improvement enables biconical antenna 10 to operate more efficiently within the low frequency range, thus providing higher near field intensities within this range.

Figure 6:
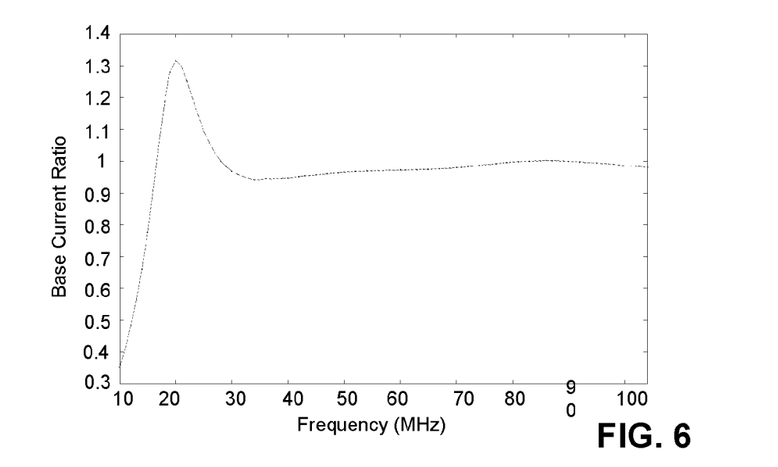
FIG. 6 is a graph illustrating a base current ratio for the biconical antenna shown in FIG. 4 over an operating frequency range of about 10-100 MHz.
Figure 7:
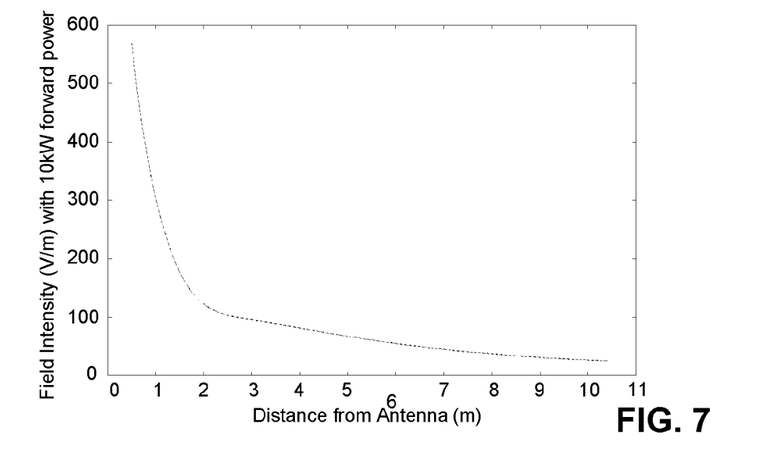
FIG. 7 is a graph illustrating the electric field intensity generated by the biconical antenna of FIG. 4 at 20 MHz with 10 kW of forward power.
Figure 8:
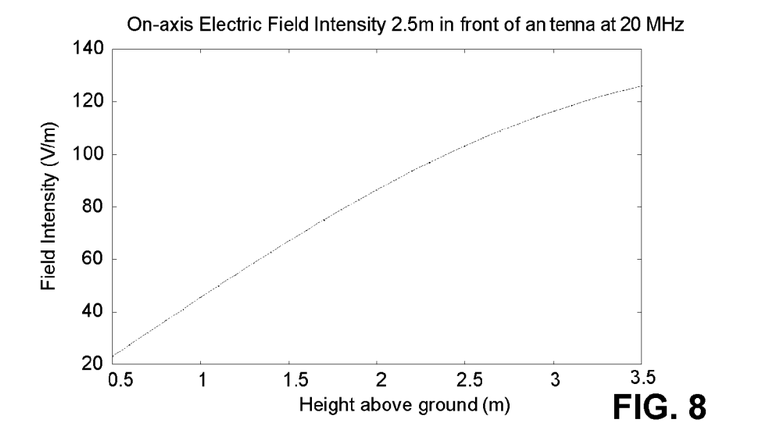
FIG. 8 is a graph illustrating the electric field intensity generated by the biconical antenna of FIG. 4 at 20 MHz with 10 kW of forward power at a distance of about 2.5 m in front of the antenna.

The substantial increases in near field intensities provided by biconical antenna 10 and high-pass matching network 20 are illustrated, for example, in FIGS. 6-8. At any given frequency, the fields generated by the antenna are proportional to the base current, or the current at the input terminals of the antenna. The ratio of the base current generated with high-pass matching elements 20 to the base current generated without matching elements is plotted in FIG. 6 over an operating frequency range extending between about 10-100 MHz. As shown in FIG. 6, high-pass matching network 20 provides the antenna with approximately one-third more base current at 20 MHz. Since the base current is proportional to field intensity, the increased base current enables significantly higher field intensities to be generated within the low frequency range.

High-pass matching network 20 also enables a larger antenna to be used, thus, providing an overall significantly better EM field for a given amplifier power. In one embodiment, biconical antenna 10 may have an overall length of about 4 meters when configured for operating up to a high frequency limit of about 100 MHz. Such a length greatly increases the E-field strength in the near field region (e.g., the region extending from the base of the antenna to about 2.5-3.0 meters in front of the antenna).

A graph is provided in FIG. 7 to illustrate exemplary E-field intensities (in V/m) that may be generated by antenna 10 and high-pass matching network 20 over a distance of about 0-11 meters in front of the antenna when supplied with approximately 10 kW of forward power. The E-field intensities generated by the antenna are illustrated for the worst case (i.e., at 20 MHz). With a 10 kW amplifier, FIG. 7 shows that the antenna produces a minimum E-field intensity of about 100 V/m on-axis (e.g., 2.5 m in front of the antenna and 2.5 m off the floor when the antenna is 2.5 m off the floor).

Obviously, the E-field generated by the antenna will decay faster at lower heights due to the image reflected by the ground plane. FIG. 8 illustrates such a concept by plotting the E-field intensity (in V/m) generated by biconical antenna 10 and high-pass matching network 20 over a range of heights. As before, the E-field intensities are illustrated for the worst case (i.e., at 20 MHz) at a distance of 2.5 m in front of the antenna. As shown in FIG. 8, the E-field intensity necessarily decreases as the antenna is lowered toward the ground plane. In any case, FIGS. 6-8 prove that better electric performance may be obtained by increasing the antenna length and offsetting the primarily inductive input reactance of the antenna with an appropriate high-pass matching network.

As noted above, high-pass matching network 20 disclosed herein may operate in conjunction with impedance transformer 30. Many different types of impedance transformers are known in the art including, but not limited to, equal-delay, Guanella, bootstrap, Ruthroff, and Faraday transformers. Baluns are transformers that are designed specifically for connecting between balanced and unbalanced circuits. In some cases, high-pass matching network 20 may be used in conjunction with a balun configuration, which is commonly used with many biconical antenna designs. In one embodiment, a 4:1 equal-delay impedance transforming balun may be used to provide a broadband 4:1 impedance transformation, as well as balancing. It is understood, however, that other impedance transformer configurations may be used in alternative embodiments of the invention.

Figure 9A:
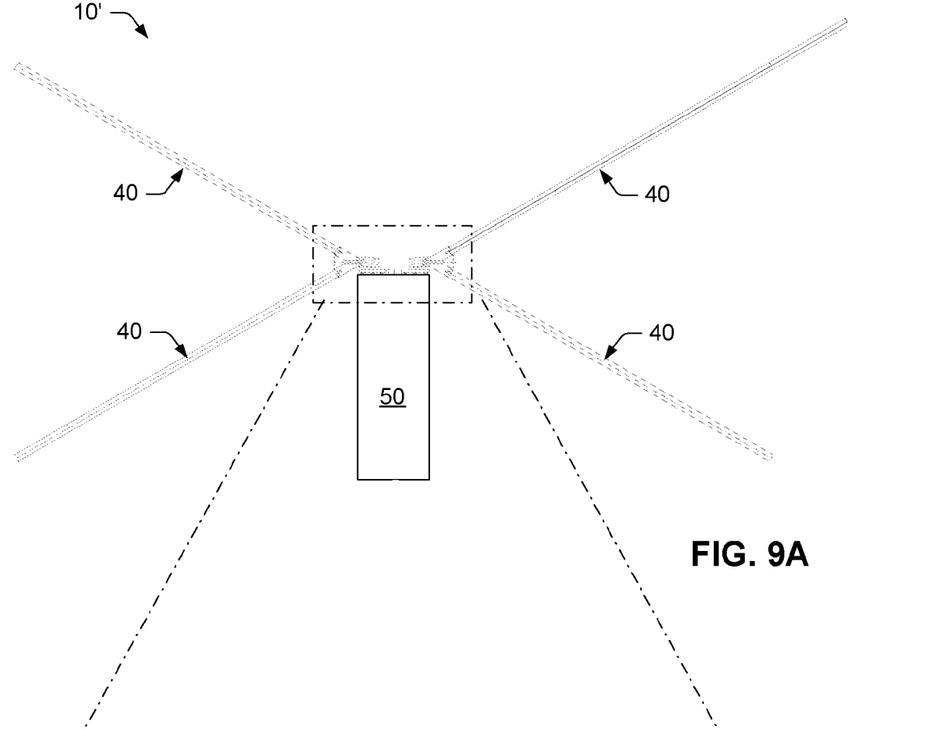
FIGS. 9A-9B are cross-sectional views illustrating an exemplary biconical antenna, according to one embodiment of the invention.
Figure 9B:
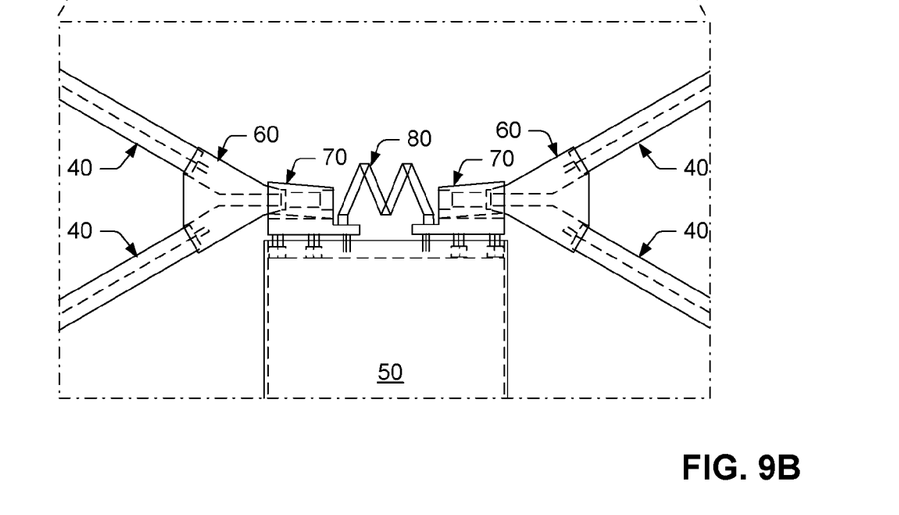

FIGS. 9A and 9B illustrate one manner in which a biconical antenna 10' in accordance with the present invention may be implemented in practice. As shown in FIGS. 9A and 9B, biconical antenna 10' may generally include a plurality of antenna elements 40 and impedance transforming balun 50. Balun 50 may include the 4:1 equal-delay impedance transforming balun discussed above. However, balun 50 is not limited to any particular impedance transformer design, and may be alternatively implemented in other embodiments of the invention.

As shown in FIGS. 9A and 9B, the four antenna elements 40 of biconical antenna 10' are coupled together at an appropriate angle by a plurality of cone-shaped structures 60 called "cones." In one embodiment, a 60° cone angle may be used to provide the antenna with approximately 4:1 bandwidth (i.e., 2 octaves). However, cones 60 are not limited to a a 60° cone angle and may be implemented with alternative cone angles in other embodiments of the invention. In some cases, a pair of ears 70 may be used to couple cones 60 to balun 50, as shown in FIG. 9B. The ears function to provide a mechanical and electrical connection between antenna elements 40 and balun 50.

As noted above, high-pass matching network 20 shown in FIG. 4 may be implemented in a variety of ways. In the embodiment of FIGS. 9A and 9B, the series capacitors included within the matching network are incorporated within the housing of balun 50, while shunt inductance 80 is coupled across ears 70. The series capacitors (not shown in FIGS. 9A and 9B) may be implemented with a variety of different capacitor designs, some examples of which include vacuum capacitors, high-voltage RF ceramic capacitors and simple plastic film capacitors (made, e.g., by inserting a conductor between high quality polymer films). In one embodiment, the series capacitors may be constructed as an open-circuit transmission line stub. Regardless of type, a typical value of capacitance for a symmetrical antenna design operating within the 20-100 MHz range may be about 100 pF. It is understood, however, that other types of capacitors (having possibly other values of capacitance) could be used in alternative embodiments of the invention.

As noted above, shunt inductor 80 may be coupled across ears 70 in at least one embodiment of the invention. The shunt inductor may be implemented numerous ways, some of which include a coil of wire (e.g., copper or Litz wire/Litzendraht) and a coil of wire wrapped around a magnetic core (e.g., ferrite or powdered iron). Although shunt inductor 80 is implemented with a coil of wire (e.g., copper) in FIG. 9B it may be preferable to construct the inductor as a short-circuit transmission line stub, in at least one embodiment of the invention. Other types of inductors not specifically mentioned herein could also be used in alternative embodiments of the invention. In addition, the inductor may be coupled somewhat differently in alternative embodiments of the invention.

One potential drawback to the embodiment shown in FIGS. 9A and 9B is that existing baluns would have to be redesigned to accomodate the series capacitors included therein. A customer having biconical antenna 10' would be required to purchase a new balun to take advantage of the performance enhancement provided by the high-pass matching network shown in FIGS. 9A and 9B.

To prevent such redesign, the series capacitors shown in FIG. 4 may be integrated within cones 60, instead of balun 50, in at least one preferred embodiment of the invention. Although integrated capacitors would increase the mass and moments associated with the cones, the integrated design would provide many desirable advantages. For example, an integrated design would allow the high-pass tuning elements to be easily and quickly swapped on-site, enabling customers to upgrade their existing balun design. This would prevent the customer from having to purchase a new balun, thus, providing substantial cost benefits. In addition, removing the capacitors from the balun would prevent the balun from being harmed should catastropic breakdown occur in the capacitors. This would not be true if the capacitors were included in the balun, itself.

Figure 10A:
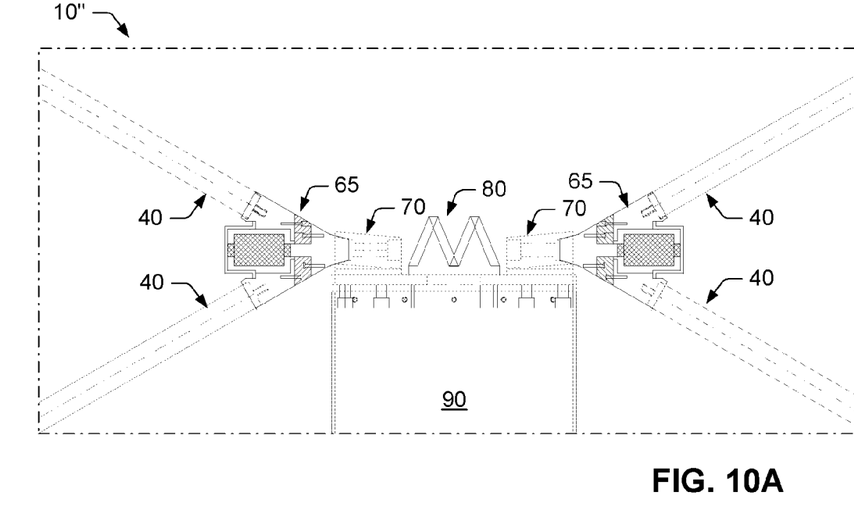
FIG. 10A is cross-sectional view illustrating an exemplary biconical antenna, according to another embodiment of the invention.
Figure 10B:
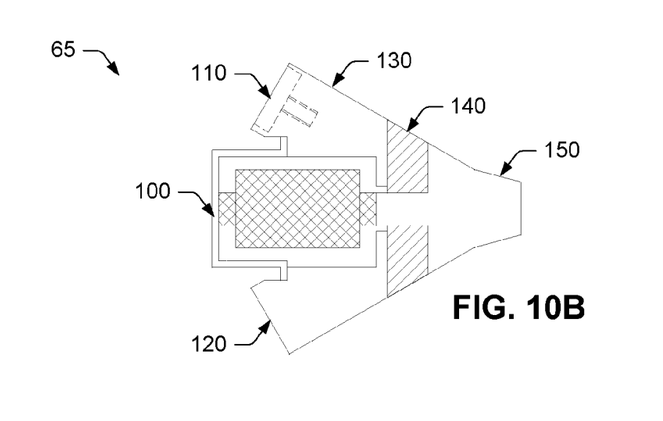
FIG. 10B is a cross-sectional view illustrating one embodiment of a modified cone structure including a series capacitor integrated therein.
Figure 10C:
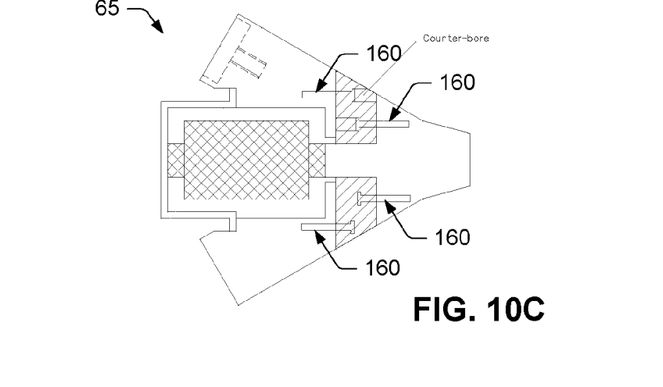
FIG. 10C is a cross-sectional view illustrating one manner in which the modified cone structure may be assembled (e.g., with mechanical fasteners)

FIGS. 10A, 10B, and 10C illustrate another manner in which a biconical antenna 10" may be implemented in accordance with the invention. Similar to the previous embodiment, biconical antenna 10" includes a plurality of antenna elements 40 coupled to an impedance transforming balun 90 via a pair of cones 65 and a pair of ears 70. As noted above, balun 90 may or may not include the 4:1 equal-delay impedance transforming balun discussed above. For the sake of brevity, similar components denoted with similar reference numerals will not be described further herein.

As before, a high pass matching network is included having a pair of series capacitors 100 in a first stage, and shunt inductance 80 in a second stage of the matching network. Unlike the previous embodiment, the high-pass matching network shown in FIGS. 10A-10C incorporates series capacitors 100 within cones 65, instead of balun 90. In one embodiment, series capacitors 100 may be implemented with an open-circuit transmission line stub located within the interior of modified cones 65. In some cases, the series capacitors may provide a capacitance of about 100 pF for a symmetrical antenna designed to operate within the 20-100 MHz range. By removing the capacitors from balun 90, the current embodiment enables the high-pass tuning elements to be swapped on-site and avoids potential damage to the balun (which could occur, e.g., if the capacitors included within balun 50 experienced catastropic breakdown).

Detailed construction of the integrated capacitors, according to one embodiment of the invention, is shown in FIGS. 10B and 10C. In these figures, each capacitor 100 is coupled in series between balun 90 and two of the antenna elements 40. In one embodiment, a "doorknob" ceramic or vacuum capacitor 100 may be coupled across two sides 110/120 of modified cone structure 65 shown in FIGS. 10B and 10C. However, one skilled in the art would understand how other types of capacitors (having possibly other values of capacitance) could be used in alternative embodiments of the invention.

In one embodiment, dielectric material 140 may be inserted between front-half 130 and back-half 150 of modified cone 65 to electrically isolate capacitor 100 from balun 90. The dielectric material is arranged on the balun side, or in other words, in the second stage of the matching network to provide the necessary isolation. In one embodiment, the dielectric material may include a disk insulator, such as a disk of FR-4 or other suitable dielectric material. However, one skilled in the art would understand how other types of dielectric materials could be used in alternative embodiments of the invention.

In some cases, front portion 130 and back portion 150 of modified cone 65 may be physically coupled together with mechanical fasteners. For example, the front and back halves of modified cone 65 may be coupled together with screws, as shown in FIG. 10C. The screws are counter-bored within dielectric material 140 and filled with an insulating material to break the electrical connection between the front and back halves of the modified cone. In another example (not shown), front portion 130, back portion 150, and dielectric material 140 may each be formed with a threaded "boss," which enables the back portion to be screwed into the dielectric material and the dielectric material to be screwed into the front portion. Alternative means not specifically mentioned herein may also be used to connect the front and back portions of modified cone structure 65. The description set forth herein is assumed to cover all such embodiments.

Various embodiments of an antenna with improved performance at a lower end of the antenna's operating frequency range have now been described. As noted above, antenna performance is improved by extending the length of the antenna elements and including a high-pass matching network comprising series capacitors in a first stage (i.e., the stage closest to the antenna elements), and a shunt inductor or inductors in a second stage (i.e., the stage furthest from the antenna elements), of the matching network. Each of the embodiments shown in FIGS. 9 and 10 improve antenna performance in the low frequency range without affecting the performance in the high frequency range. However, the embodiment shown in FIG. 10 provides a means for easily and quickly upgrading an existing antenna design with the performance enhancements described herein, thus, minimizing upgrade costs and time.

Figure 11:
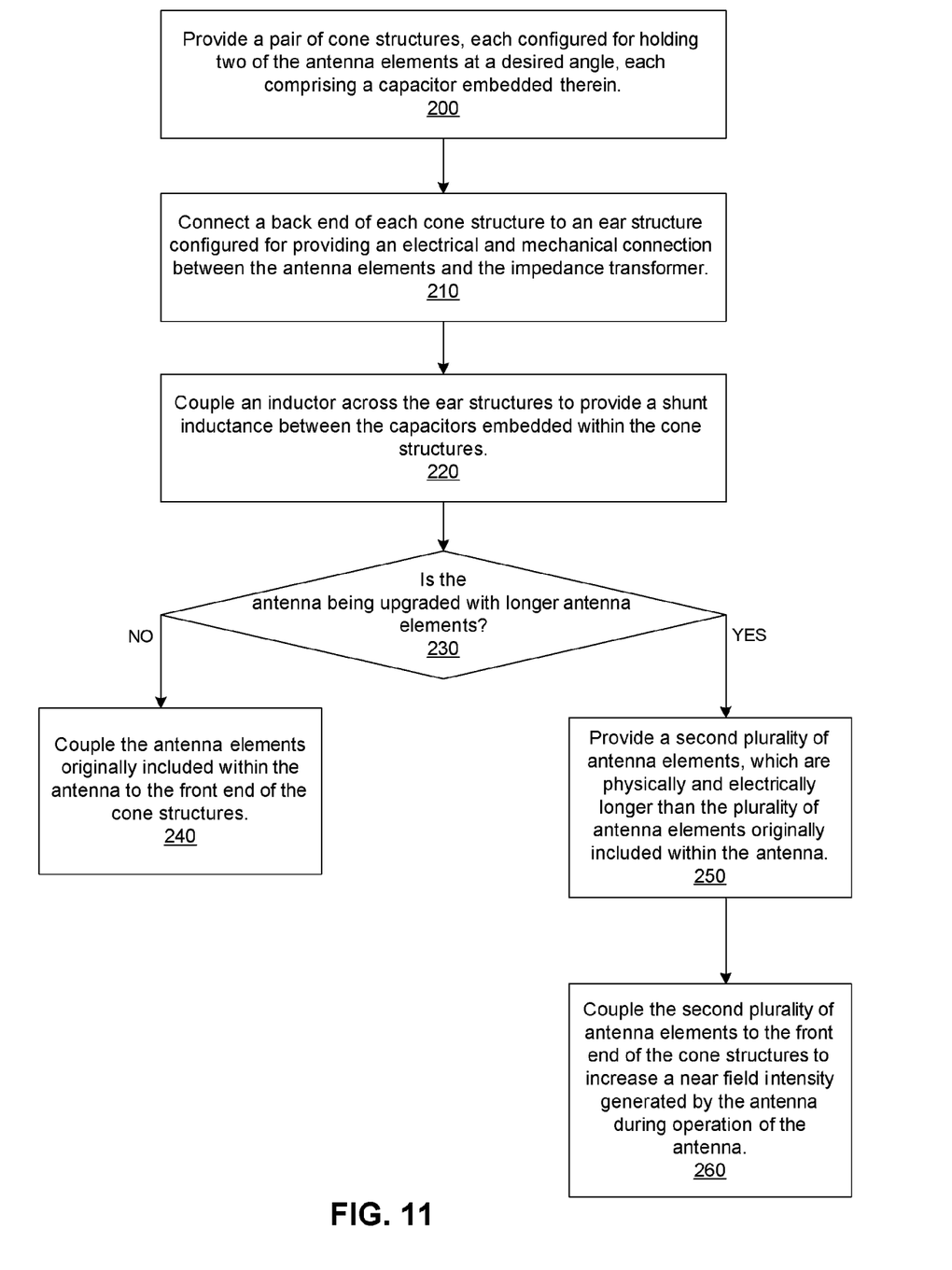
FIG. 11 is a flowchart diagram illustrating one embodiment of a method, in accordance with the invention.

FIG. 11 illustrates one embodiment of a method that may be used for improving the performance of an antenna at a lower end of the antenna's operating frequency range. It is contemplated that the method may be performed by a manufacturer of the antenna, an end-user of the antenna or a technician commissioned to install a new antenna or upgrade an existing antenna design with the components shown in FIGS. 10A-10C. However, the method is not limited to any particular person or persons and may be performed by any person skilled in the art. Furthermore, the method is not strictly limited to the embodiment shown in FIGS. 10A-10C. In some cases, the method steps set forth below may be adapted or modified to accommodate other high-pass matching network configurations having first stage series capacitors and second stage shunt inductors.

In one embodiment, the antenna described in the method may be a tapered dipole antenna comprising four antenna elements. As set forth above, the antenna elements may be coupled to an impedance transformer via a high-pass matching network comprising at least two series capacitors and at least one shunt inductor. However, the method described herein may be adapted for installing or upgrading other types of antennas, having possibly different numbers and/or configurations of antenna elements and matching network components. Although the method steps set forth below are described as if performed in a specific order, one skilled in the art would understand how the steps could be performed in a substantially different order without departing from the scope of the invention.

In one embodiment, the method may begin (in step 200) by providing a pair of cone structures, each configured for holding two of the antenna elements at a desired angle. Each of the cone structures may have a capacitor embedded therein. The capacitor may be coupled in series between the impedance transformer and the two antenna elements for providing a first stage capacitance. The capacitors embedded within the pair of cone structures may or may not have the same value of capacitance.

Next, the method may include connecting (in step 210) the back end of each cone structure to an ear structure, which provides an electrical and mechanical connection between the antenna elements and the impedance transformer. As noted above, an inductor may be coupled (in step 220) across the ear structures to provide a shunt inductance between the capacitors embedded within the cone structures. The embedded capacitors and the shunt inductor operate to improve the performance of the dipole antenna at the lower end of the antenna's operating frequency range.

In some cases, the inductor may be coupled across the ear structures before the back end of the cone structure is connected thereto. In other cases, the inductor may be coupled to the ears after connecting the cones to the ears. In some cases, the inductor may be connected to the ears using existing holes formed within the ears. However, since not all of units may have such holes, the inductor may also be connected to the ears using the mounting screws typically used for connecting the ears to the balun.

In some cases, it may be desirable to exchange the original antenna elements for new ones. If an existing antenna design is to be upgraded (in step 230) with longer antenna elements, the method may include providing (in step 250) a second plurality of antenna elements, which are physically and electrically longer than the antenna elements originally included with the antenna. The longer antenna elements may be coupled (in step 260) to the front end of the cone structures, in lieu of the original antenna elements, to increase a near field intensity generated by the antenna during operation thereof. If no upgrade is desired, the method may end after connecting (in step 240) the antenna elements originally included with the antenna to the front end of the cone structures. In the upgrade embodiment, it may be necessary to remove the existing antenna elements from the antenna prior to providing the cone structures (in step 200).

It will be appreciated to those skilled in the art having the benefit of this disclosure that this invention is believed to provide a dipole antenna with improved performance in the low frequency range. More specifically, the invention provides a unique high-pass matching network, which allows the dipole antenna to operate more efficiently in the frequency range in which its input impedance becomes inductive (e.g., within the low frequency range). Further modifications and alternative embodiments of various aspects of the invention will be apparent to those skilled in the art in view of this description. It is intended, therefore, that the following claims be interpreted to embrace all such modifications and changes and, accordingly, the specification and drawings are to be regarded in an illustrative rather than a restrictive sense.

What is claimed is:

1. An antenna comprising a plurality of antenna elements coupled to an impedance transformer via a pair of mounting structures and a matching network including:
   at least two capacitors, each coupled in series between the impedance transformer and a different one of the antennal elements;
   at least one inductor coupled in shunt between the at least two capacitors; and
   wherein the matching network improves antenna performance at a lower end of the antenna's operating frequency range by positioning the at least two capacitors ahead of the at least one inductor in a network stage arranged closer to the antenna elements, and wherein at least a portion of the matching network is incorporated within the pair of mounting structures.

2. The antenna as recited in claim 1, wherein during operation, the antenna exhibits a voltage standing wave ratio (VSWR) of less than about 3:1 at the lower end of the antenna's operating frequency range.

3. The antenna as recited in claim 1, wherein the antenna comprises a dipole antenna.

4. The antenna as recited in claim 1, wherein pair of mounting structures comprises:

a pair of cones, each configured for supporting one of the plurality of antenna elements; and a pair of ears, each configured for connecting one of the cones and its associated antenna element to the impedance transformer.

5. The antenna as recited in claim 4, wherein the at least one inductor is coupled across the pair of ears.

6. The antenna as recited in claim 4, wherein the at least two capacitors are integrated within the pair of cones.

7. The antenna as recited in claim 4, wherein each cone comprises:

a front portion configured for holding two of the antenna elements at a desired angle, wherein the front portion includes one of the capacitors;

a back portion coupled to the front portion and configured for connecting the cone to one of the ears;

a dielectric material arranged between the front portion and the back portion to electrically isolate the capacitor from the impedance transformer; and means for physically connecting the front portion to the back portion.

8. The antenna as recited in claim 7, wherein said means comprise a plurality of screws, which are counter-bored within the dielectric material and filled with an insulating material to electrically isolate the front and back portions of the cone.

9. The antenna as recited in claim 7, wherein said means comprise forming the front portion, the back portion and the dielectric material with a threaded boss, which enables the back portion to be screwed into the dielectric material and the dielectric material to be screwed into front portion.

10. An antenna, comprising:

a plurality of antenna elements, wherein a maximum dimension of the antenna elements is about 4 meters;

a mounting structure configured for coupling the plurality of antenna elements to an impedance transformer, wherein the mounting structure comprises:

a pair of cone structures, each configured for holding two of the antenna elements at a desired angle; and a pair of ear structures, each configured for connecting one of the cone structures to the impedance transformer, thus, providing an electrical and mechanical connection between the antenna elements and the impedance transformer; and a high-pass matching network comprising:

at least two capacitors, each embedded within one of the cone structures so as to be coupled in series between the two antenna elements and the impedance transformer; and at least one inductor connected across the pair of ear structures in shunt with the at least two capacitors.

11. A matching network configured to improve the performance of an antenna at a lower end of the antenna's operating frequency range, wherein at least a portion of the matching network is incorporated within a pair of mounting structures configured for coupling radiating elements of the antenna to an impedance transformer, wherein the matching network comprises:

at least two capacitors, each embedded within one of the mounting structures, and arranged such that the capacitors are coupled in series between different radiating elements of the antenna and the impedance transformer; and at least one inductor coupled across the pair of mounting structures in shunt between the at least two capacitors, wherein the at least one inductor is positioned behind the at least two capacitors in a network stage arranged farther away from the radiating elements of the antenna.

12. The matching network as recited in claim 11, wherein the matching network comprises a high-pass matching network configured for improving the performance of the antenna at the lower end of the antenna's operating frequency range without affecting performance at a higher end of the antenna's operating frequency range.

13. The matching network as recited in claim 11, wherein during operation, the matching network enables the antenna to exhibit a voltage standing wave ratio (VSWR) of less than about 3:1 at the lower end of the antenna's operating frequency range.

14. The matching network as recited in claim 11, wherein the pair of mounting structures comprise:

a pair of cone structures, each configured for holding two of the radiating elements at a desired angle; and a pair of ear structures, each configured for connecting one of the cone structures to the impedance transformer, thus, providing an electrical and mechanical connection between the radiating elements and the impedance transformer; and wherein the at least two capacitors are integrated within the pair of cone structures, each of which is configured for coupling two radiating elements of the antenna to the impedance transformer.

15. The matching network as recited in claim 14, wherein each cone structure comprises:

a front portion configured for holding the two radiating elements at a desired angle, wherein the front portion includes one of the pair of capacitors; and a back portion coupled to the front portion and configured for connecting the cone structure to the impedance transformer via one of the ear structures.

16. The matching network as recited in claim 15, wherein each cone structure further comprises:

a dielectric material arranged between the front portion and the back portion to electrically isolate the capacitor from the impedance transformer; and means for physically connecting the front portion to the back portion.

17. The matching network as recited in claim 16, wherein said means comprise a plurality of screws, which are counter-bored within the dielectric material and filled with an insulating material to electrically isolate the front and back portions of the cone structure.

18. The matching network as recited in claim 16, wherein said means comprise forming the front portion, the back portion and the dielectric material with a threaded boss, which enables the back portion to be screwed into the dielectric material and the dielectric material to be screwed into front portion.

19. A method for improving the performance of an antenna at a lower end of the antenna's operating frequency range, the antenna comprising a plurality of antenna elements coupled to an impedance transformer, wherein the method comprises:

providing a pair of cone structures, each configured for holding two of the antenna elements at a desired angle, wherein each cone structure comprises a capacitor embedded therein;

connecting a back end of each cone structure to an ear structure, which is configured for providing an electrical and mechanical connection between the antenna elements and the impedance transformer;

coupling an inductor across the ear structures to provide a shunt inductance between the capacitors embedded within the cone structures, wherein the embedded capacitors and the shunt inductor operate to improve the performance of the dipole antenna at the lower end of the antenna's operating frequency range.

20. The method as recited in claim 19, further comprising:
providing a second plurality of antenna elements, which are physically and electrically longer than the plurality of antenna elements originally included within the antenna; and coupling the second plurality of antenna elements to the front end of the cone structures to increase a near field intensity generated by the antenna during operation of the antenna.

\* \* \* \* \*

UNITED STATES PATENT AND TRADEMARK OFFICE
CERTIFICATE OF CORRECTION

| | | |
|---|---|---|
| PATENT NO. | : 7,859,478 B2 | |
| APPLICATION NO. | : 12/061213 | |
| DATED | : December 28, 2010 | |
| INVENTOR(S) | : McLean | |

It is certified that error appears in the above-identified patent and that said Letters Patent is hereby corrected as shown below:

IN THE CLAIMS:

Claim 4 at col. 12, line 66: After "wherein" please add --the--.

Signed and Sealed this
Twenty-ninth Day of March, 2011

David J. Kappos
*Director of the United States Patent and Trademark Office*